United States Patent
Lee et al.

(10) Patent No.: US 8,633,408 B2
(45) Date of Patent: Jan. 21, 2014

(54) MINIATURE HOUSING AND SUPPORT ARRANGEMENT HAVING AT LEAST ONE MINIATURE HOUSING

(75) Inventors: Charles Lee, Taipei (TW); Feng Sheng, Shanghai (CN); Jenny Zhou, Shanghai (CN)

(73) Assignee: OSRAM Opto Semiconductors GmbH, Regensburg (DE)

( * ) Notice: Subject to any disclaimer, the term of this patent is extended or adjusted under 35 U.S.C. 154(b) by 417 days.

(21) Appl. No.: 12/920,305

(22) PCT Filed: Feb. 18, 2009

(86) PCT No.: PCT/DE2009/000248
§ 371 (c)(1),
(2), (4) Date: Jan. 17, 2011

(87) PCT Pub. No.: WO2009/106051
PCT Pub. Date: Sep. 3, 2009

(65) Prior Publication Data
US 2011/0100707 A1 May 5, 2011

(30) Foreign Application Priority Data
Feb. 29, 2008 (DE) .......................... 10 2008 011 862

(51) Int. Cl.
*H01L 23/48* (2006.01)
*H01L 33/00* (2010.01)
*H01R 9/00* (2006.01)
*H05K 7/02* (2006.01)

(52) U.S. Cl.
USPC ............. 174/549; 257/99; 361/773; 361/807; 361/809; 361/810

(58) Field of Classification Search
USPC .................. 174/527, 549; 361/772–774, 760; 439/65, 857; 257/99; 362/612
See application file for complete search history.

(56) References Cited

U.S. PATENT DOCUMENTS

| | | | | |
|---|---|---|---|---|
| 6,680,568 B2* | 1/2004 | Fujiwara et al. | ............... | 313/501 |
| 6,943,433 B2* | 9/2005 | Kamada | ........................ | 257/666 |
| 2002/0008325 A1* | 1/2002 | Tominaga | ..................... | 257/778 |
| 2003/0227769 A1 | 12/2003 | Osawa | | |

(Continued)

FOREIGN PATENT DOCUMENTS

| | | |
|---|---|---|
| CN | 1685578 | 10/2005 |
| DE | 19508284 | 1/1996 |

(Continued)

OTHER PUBLICATIONS

Osram, Opto Semiconductors, "Possible Solution by Modifying LW Y1SG", Jul. 11, 2007.

*Primary Examiner* — Jeremy Norris
*Assistant Examiner* — Sherman Ng
(74) *Attorney, Agent, or Firm* — Cozon O'Connor (57) ABSTRACT

A miniature housing, in whose housing body there is located an element emitting or receiving electromagnetic radiation, comprises at least two electrical terminal means projecting laterally beyond the housing body. The passage side of the miniature housing, through which the element emits or receives, is oriented substantially perpendicularly to the mounting plane of the miniature housing. The electrical terminal means of the miniature housing projecting laterally beyond the housing body are connected electrically conductively to conductors, which bring about direct contacting with the emitting or receiving element. The contacting faces of the terminal means are thus arranged substantially perpendicular to the passage side of the miniature housing. As a result of this arrangement the miniature housing may be embedded at least in part in a support, such that the miniature housing is no longer of any significance to the thickness of a lighting device.

14 Claims, 4 Drawing Sheets

(56) References Cited

U.S. PATENT DOCUMENTS

| | | |
|---|---|---|
| 2004/0126913 A1* | 7/2004 | Loh .................. 438/26 |
| 2004/0248332 A1* | 12/2004 | Yoon ................. 438/29 |
| 2005/0063183 A1 | 3/2005 | Swaris et al. |
| 2005/0139846 A1* | 6/2005 | Park et al. ............ 257/98 |
| 2005/0269589 A1 | 12/2005 | Wu |
| 2006/0131602 A1 | 6/2006 | Ouderkirk |
| 2006/0267036 A1* | 11/2006 | Lee et al. ............. 257/98 |
| 2006/0273337 A1 | 12/2006 | Han et al. |
| 2007/0008739 A1* | 1/2007 | Kim et al. ............ 362/612 |
| 2007/0081313 A1* | 4/2007 | Tanaka et al. ......... 361/767 |
| 2007/0230182 A1* | 10/2007 | Tai et al. ............. 362/294 |

FOREIGN PATENT DOCUMENTS

| | | |
|---|---|---|
| DE | 197 51 911 | 6/1999 |
| DE | 101 40 831 | 3/2003 |
| DE | 10 2004 047 061 | 4/2006 |
| DE | 20 2007 014 910 | 1/2008 |
| DE | 10 2007 006 583 | 8/2008 |
| EP | 0 646 971 | 4/1995 |
| EP | 1217291 | 6/2002 |
| EP | 1 396 891 | 3/2004 |
| EP | 1998380 | 12/2008 |
| JP | 1-100561 | 4/1989 |
| JP | 03-039863 | 2/1991 |
| JP | 05327021 | 12/1993 |
| JP | 2000-310613 | 11/2000 |
| JP | 2003-298119 | 10/2003 |
| WO | WO 2006/123917 | 11/2006 |
| WO | WO 2006/126809 | 11/2006 |
| WO | WO 2007/055486 | 5/2007 |
| WO | WO 2008/038978 | 4/2008 |

* cited by examiner

MINIATURE HOUSING AND SUPPORT ARRANGEMENT HAVING AT LEAST ONE MINIATURE HOUSING

RELATED APPLICATIONS

This is a U.S. national stage of application No. PCT/DE2009/000248 filed Feb. 18, 2009.

This patent application claims priority from German patent application no. 102008011862.1 filed Feb. 29, 2008, the disclosure content of which is hereby incorporated by reference.

FIELD OF THE INVENTION

The invention relates to a miniature housing with an element emitting or receiving electromagnetic radiation and a support arrangement with at least one such miniature housing.

BACKGROUND OF THE INVENTION

In addition to small-size sensors based on electromagnetic radiation, as are used inter alia in the automotive industry, it is barely possible to imagine daily life without the specially miniaturised lighting devices one comes across in many different applications. Examples which may be mentioned are display means, backlighting for flat screens and displays of mobile telephones or MP3 players. In the case in particular of portable apparatuses, the trend is clearly towards even smaller embodiments, the ultimate aim being to increase user comfort. With regard to display technology, miniaturisation means in particular further reducing the thickness of the lighting devices. Thicknesses of approx. one millimetre are currently usual for LED screen lighting devices, for instance in laptops. With regard to sensors, which are intended for example for integration in windows or thin surfaces, the thickness thereof is likewise a critical parameter.

SUMMARY OF THE INVENTION

It is an object of the invention to provide a miniature housing for an element receiving or emitting electromagnetic radiation and a suitable support arrangement.

This and other objects are attained in accordance with one aspect of the present invention directed to a miniature housing comprising a housing body, with an element emitting or receiving radiation, which element is located inside the housing body and emits or receives the radiation through a passage side of the housing body, and the housing body comprising a top, which is oriented transversely of the passage side; conductors, which effect an electrically conductive connection of the element to the outside of the housing body; and electrical terminal means, with which the conductors are connected, the terminal means projecting laterally beyond the housing body and comprising contacting faces, which are oriented parallel to the top of the housing body.

The miniature housing, in whose housing body there is located an element emitting or receiving electromagnetic radiation, comprises at least two electrical terminal means projecting laterally beyond the housing body. The passage side of the miniature housing, through which the element emits or receives, is oriented transversely of or substantially perpendicularly or perpendicularly to the mounting plane of the miniature housing. The electrical terminal means of the miniature housing projecting laterally beyond the housing body are connected electrically conductively to conductors, which bring about direct contacting with the emitting or receiving element. The contacting faces of the terminal means are thus arranged substantially perpendicular to the passage side of the miniature housing. As a result of this arrangement the miniature housing may be embedded at least in part in a support, such that the miniature housing is no longer of any significance with regard to the thickness of a lighting device. "Substantially" here means in particular within the bounds of manufacturing tolerances.

In addition to the miniature housing itself, a support arrangement is mentioned, which achieves the described object particularly well and also simplifies production of the support arrangement.

A one-piece embodiment of electrical conductors and terminal means enables particularly simple production of the terminal means, for example by bending. In addition, fewer individual parts need to be taken into account and the number of production steps is reduced.

A multi-piece embodiment of electrical conductors and of terminal means connected conductively therewith allows existing configurations of miniature housings to be modified with relatively little effort. In addition, flexibility is increased with regard to housing design, and manufacture may thereby also be kept variable.

Electrical terminal means projecting beyond the housing body on at least two sides make it simpler to fit the housings for instance at the corners of a support with suitable recesses. Outward differentiation between the terminals, for example cathode and anode, is also simplified.

With terminal means which project on two opposing sides of the housing body it is possible to achieve a configuration which requires only a few modifications compared with common housings, thereby allowing simple adaptation. In addition, in this way generally two opposing sides of the housing body are also free of projecting parts, such that the miniature housing is for example easier for a robot arm to grip for the purposes of manufacture.

Terminal means which substantially take the form of small flat plates minimise the space requirement perpendicularly to the support. This type of embodiment also ensures larger areas bearing on a support, and thus potentially also larger contact surfaces. Small plates may also be manufactured in many different shapes, for instance by punching. Small plates may mean that the maximum lateral extent exceeds the thickness by at least a factor of 5, in particular by at least a factor of 10. For example the small plates are of planar configuration within the bounds of production tolerances. In other words the small plates are preferably smooth and flat.

L-shaped electrical terminal means may be easily produced, for example by bending, as continuations of the conductors from the emitting or receiving element and are therefore a particularly cost-effective configuration.

Terminal means located on the top or bottom of the housing body are easy to fit during production and subsequently allow good access to the terminal means from above or below respectively, for example on contacting of the miniature housing.

With terminal means which project beyond the housing body substantially as extensions of the top or bottom thereof, a particularly flat configuration may be achieved. "As extensions" may mean that a major face of the terminal means is oriented within the bounds of manufacturing tolerances parallel to the top and/or bottom and in that the top and/or the bottom is flush with the major side.

With a rectangular miniature housing body outline the machine handleability thereof is made simpler, since lateral gripping by a robot arm or the like is more readily possible.

Storage or packaging of parts with a rectangular outline is often more economical with regard to space.

If electrical conductors and terminal means are of multi-piece construction, this, as has already been mentioned above, increases flexibility in housing design and expands design options for the terminal means. The conductors from the element may be guided firstly on the inside or also on the outside, in particular laterally, out of the housing body and towards the top or bottom of the housing body. Then these conductors may be contacted with relatively little effort with suitable terminal means at the top or bottom of the housing body.

The inclusion of additional, electrically conductive adapters, which are fitted electrically conductively between conductors and terminal means, also increases the scope for design of the miniature housing.

As a common and effective component, it is preferred to use a light emitting diode, conventionally known as an LED, as the radiation-emitting or -receiving element when the miniature housing is used for lighting purposes.

Since miniature housings are intended not to extend very far as regards their height, it is advantageous for the housing bodies to be flat, i.e. for the lateral extent thereof to be markedly greater than the height of the miniature housing in at least one direction. A design-determined height of less than 0.8 mm, in particular of less than 0.6 mm is here particularly advantageous.

The support arrangement comprises a support and at least one miniature housing. The support is such that it comprises a support front substantially parallel to the passage side of the miniature housing, and a support top transverse or substantially perpendicular thereto. In this way, and because the contacting faces of the terminal means of the miniature housing rest substantially flat on the support top, space requirements with regard to height are minimised. "Substantially" here means in particular within the bounds of manufacturing tolerances.

If the housing body of the miniature housing is located in front of the support front, machining steps for instance for producing recesses in the support may be dispensed with. A very compact arrangement of miniature housings along the support front is also made possible in this way.

If the support comprises at least one suitable recess, the miniature housing may be embedded in a space-saving manner in this recess. In this way it is possible, in particular, to keep small the extent of the support arrangement in the direction perpendicular to the support front and parallel to the support top.

It is particularly advantageous for the housing body to be located completely in a recess or to be fitted in such a way in front of the support front that it does not project upwards or downwards beyond the support top or support bottom respectively.

Electrical supply conductors on the support make it possible to contact the miniature housings electrically in a simple manner. Additional, bulky or complex devices such as wiring systems may in this way be omitted if the supply conductors are suitably embodied.

A particularly favourable variant consists in fitting the electrical supply conductors in a suitable manner only on one side of the support, whereby complex treatment or preparation of a further support side may be omitted.

If the passage side of the miniature housing terminates flush with the support front, a substantially uniform, very largely smooth front may be ensured. Since no forwardly projecting parts occur, the risk of damage is minimised.

Extensive contacting via the front of the support with for example a line or planar light guide is also simplified in this way.

A recess in the support configured substantially in the form of a segment of a circle may be produced particularly simply by a milling or drilling process and offers a simple, flexible design option for the recess, depending on the opening angle of the circle segment.

If the recess is substantially rectangular, which is simple to achieve for example by punching, this offers a good and relatively precise accommodation option for the miniature housing, in particular in the case of miniature housings with a rectangular housing body outline.

By configuring the recess as a form fit with regard to the housing body, it is possible to fix the embedded miniature housing spatially with little effort. This applies in particular if the miniature housing rests at least partially against the boundary surfaces of the recess.

Through a step-like configuration of the recess, it is possible to ensure that both housing body and terminal means are embedded in the recess. Parts are prevented from projecting beyond the support and the resultant support arrangement is compact and easier to handle.

If the recess in the support has a narrowed portion parallel to the support front, the miniature housing may be fixed better inside the recess and also positioned more precisely. Likewise, if the recess is suitably configured at least temporary mechanical holding of the miniature housing is made possible.

A mechanically flexible support allows the entire support arrangement to take the form of a mechanically flexible arrangement. This allows use for example in flexible displays.

If the support contains at least one thermally conductive material, any thermal load which occurs as a result of operation of the emitting or transmitting elements may be reduced, since the waste heat is effectively dissipated.

To save space, it is useful for the support arrangement to have a thickness of at most 1 mm, in particular of at most 0.6 mm.

Positioning markers or retaining devices may be formed by notches or slits, recesses, bulges or bumps on the support of the support arrangement, these allowing simple detection for example of the correct position of the support arrangement in a mounting procedure or indeed simplifying locking or fastening of the support arrangement for instance on a light guide or a housing.

A method for producing a support arrangement is additionally provided. With the method it is possible to produce a support arrangement as indicated in relation to one or more of the described embodiments.

The method for producing a support arrangement with a support and with at least one miniature housing comprises the steps:

providing the support, positioning the at least one miniature housing on the support, contacting of at least one electrical terminal means with at least one electrical supply conductor.

Because the method for producing a support arrangement includes provision of the support, positioning of the miniature housing and contacting of the electrical terminal means, the at least one recess which may possibly be located in the support may be produced by means of a common, inexpensive method such as drilling, milling or punching, or the recess may be provided in the support as early as in the course of a casting process, which reduces production costs.

If the electrical supply conductors on the support are produced by methods such as photolithography or printing, corresponding supports may be produced inexpensively in large numbers.

The production method is also simplified, and thus costs also reduced, if the miniature housings are held mechanically on the support at least temporarily using suitably configured recesses or terminal means, before for example in a next manufacturing step the miniature housings are finally fixed via the electrical contacts by means of soldering or adhesive bonding and intermediate holding may thus be dispensed with.

By bending the electrical conductors guided out of the housing body into suitable terminal means, savings may be made in terms of operations and thus costs.

Contacting of terminal means with the supply conductors on the support is advantageously and inexpensively carried out by a method such as soldering, adhesive bonding or pressing, particularly advantageously and efficiently by bending, folding or kinking suitably configured terminal means and supply conductors.

It is particularly practical for use of the support arrangement for lighting purposes to couple the support arrangement to a light guide by means of an adhesive bonding, welding or casting process. In this way reflection losses at boundary surfaces and coupling-in losses due to divergent radiation may be reduced.

BRIEF DESCRIPTION OF THE DRAWINGS

The invention is described below by way of exemplary embodiments with reference to the drawings. Elements which are the same in the individual figures are indicated with the same reference numerals, but the elements shown are not to scale relative to one another.

In the drawings.

Figure 1A:
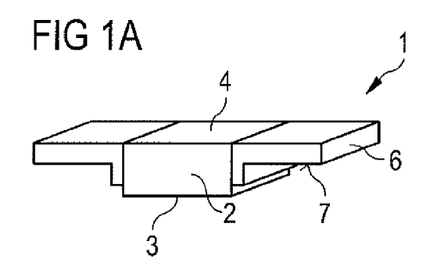
FIG. 1 is a schematic representation of different embodiments a), b), c) and d) of the L-shaped terminal means of the miniature housing.
Figure 1B:
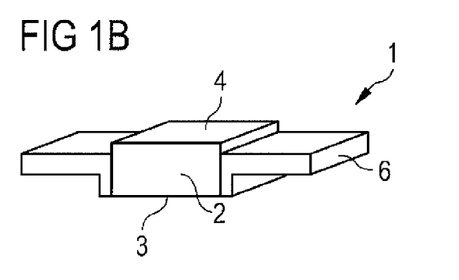
Figure 1C:
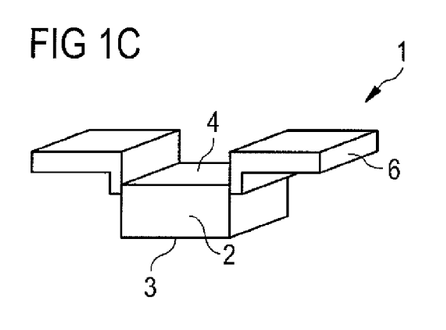
Figure 1D:
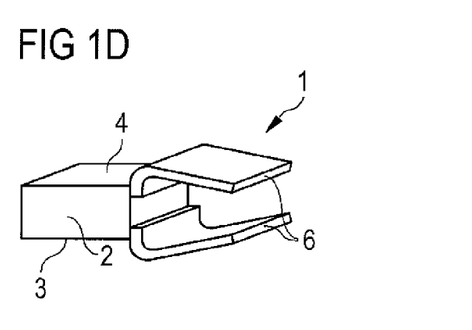

DETAILED DESCRIPTION OF THE DRAWINGS:

FIG. 1a shows an exemplary embodiment of a miniature housing 1, in which terminal means 6 of L-shaped configuration project laterally beyond a housing body 3. The terminal means 6 are fastened laterally to the housing body 3 or develop by bending from conductors 5, not shown, guided laterally out of the housing body 3. A one-piece or multi-piece embodiment of conductors 5 and terminal means 6 is possible. In FIGS. 1a, 1b and 1c the terminal means 6 are fitted on opposing sides of the housing body 3. Alternatively, the terminal means 6 may also, as shown in FIG. 1d, be fitted on the same side of the housing body 3, wherein the parts of the legs of the Ls which adjoin the housing body 3 are directed towards one another. Unlike in FIG. 1d the L-legs may also be directed away from one another or indeed in the same direction.

In the exemplary embodiment shown in FIG. 1a, the laterally projecting legs of the L-shaped terminal means 6 are fitted as extensions of the top 4 of the housing body 3. This may vary depending on requirements, such that the relevant legs project more from the middle of the housing body 3, as shown in FIG. 1b, or indeed outwards above the housing body 3, as shown in FIG. 1c. The greater space requirement with regard to the height of the components may be justified for example due to more favourable mechanical characteristics or better handleability of the miniature housing 1.

In the above-stated exemplary embodiments the terminal means are constructed parallel to the top 4 or bottom of the housing body 3. For applications in which a miniature housing 1 is held at least temporarily by the terminal means 6 for example during mounting on a support 9, a not wholly right-angled configuration of the terminal means 6 is suitable. By slight overbending, such that the angle between the legs of the L is smaller than 90°, a clamping action unfolds, such as for example in the design according to FIG. 1d. The contacting faces 7 should here substantially still be regarded as being oriented parallel to the top 4 of the housing body 3. It may be sufficient for the clamping action to configure just one of the terminal means 6 not as a right angle.

It may also be beneficial for the angle between the legs of the L to be somewhat greater than 90°, if for example the terminal means 6 are fitted on one side of the housing body 3 and the miniature housing 1 is pushed laterally onto a support 9. With the resultant, slightly V-shaped orientation of the terminal means 6 a type of funnel is formed, which increases positioning tolerance with regard to height on the support 9 when fitting the miniature housing 1.

Figure 2:
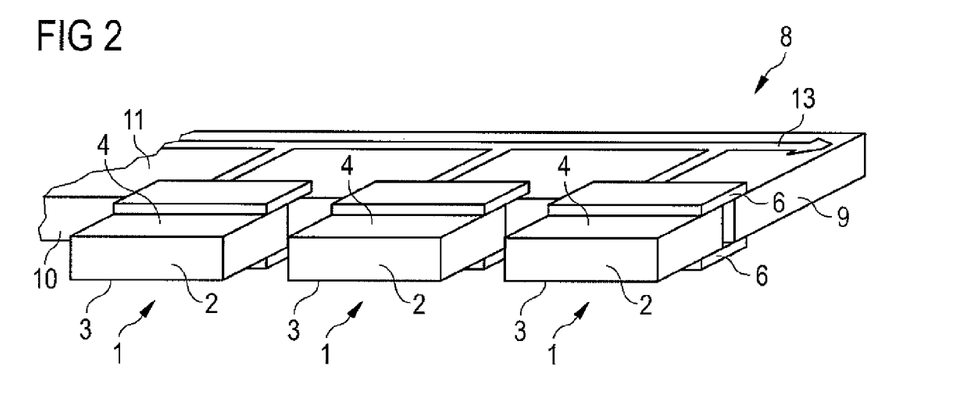
FIG. 2 is a schematic representation of an exemplary embodiment of a support arrangement with a plurality of miniature housings.

FIG. 2 shows a further exemplary embodiment, wherein for the time being only the miniature housing 1 itself will be looked at. The electrical terminal means 6 take the form of small plates and are located on the top 4 or bottom of the housing body 3. The terminal means 6 are here of multi-piece construction and connected electrically conductively with the conductors 5, not shown, guided to the bottom or top 4 of the housing body 3. In the case in particular of this multi-piece embodiment of conductors 5 and terminal means 6, the small plates used as terminal means 6, which may be formed for example from metal, a conductive polymer or indeed from a transparent glass coated with indium tin oxide, may be suitably configured prior to fitting on a housing body 3. Small plates ranging from, as in FIG. 2, rectangular and entirely planar through round, slightly dished designs to lug-like shapes are possible. Projection of a single terminal means 6 beyond two sides of the housing body 3 is also a suitable embodiment for, for example, optimising fitting of the terminal means on the housing body 3. A one-piece embodiment of conductors 5 and terminal means 6, as described above with regard to FIG. 1, is not ruled out.

It goes without saying that, in addition to the design options of the small plate shape, it is also possible with this exemplary embodiment to vary the position in which the terminal means 6 are fitted on the housing body 3 and beyond how many and which sides and in which precise direction they project. This applies not only to the exemplary embodiments just described but also to all the following exemplary embodiments.

Figure 3A:
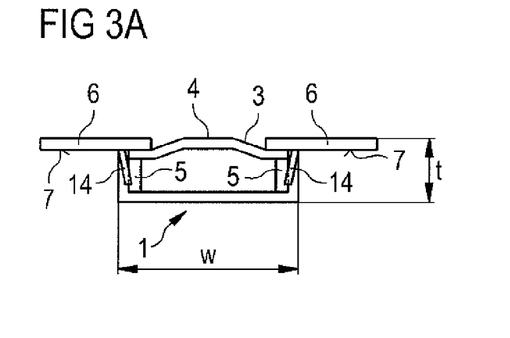
FIG. 3 shows a front view a) and a plan view b) of a miniature housing.
Figure 3B:
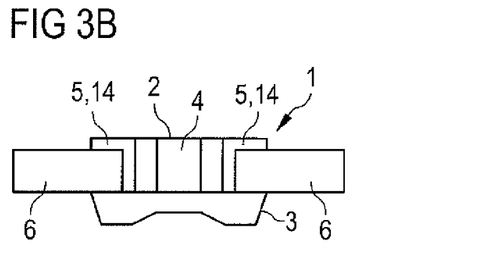

FIG. 3 illustrates a further configuration of the miniature housing 1. Between the conductors 5 of the element emitting or receiving electromagnetic radiation and the electrical terminal means 6 at least one adapter 14 is fitted, so resulting in an electrically conductive connection of the element and the terminal means 6. This simplifies the adaptation of existing housing configurations. Suitable, in particular metallic adapters may also be advantageous when it comes to dissipating the thermal output or waste heat which arises during operation of the element. Relatively high operating currents, in part determined by a relatively large possible conductor cross-section, may thus be achieved. Since the adapter 14 may be incorporated into the housing body 3 during injection moulding thereof, there is the maximum possible scope with regard to the shape of the adapter, within the limitations of the small geometric dimensions of the miniature housing 1.

Figure 7:
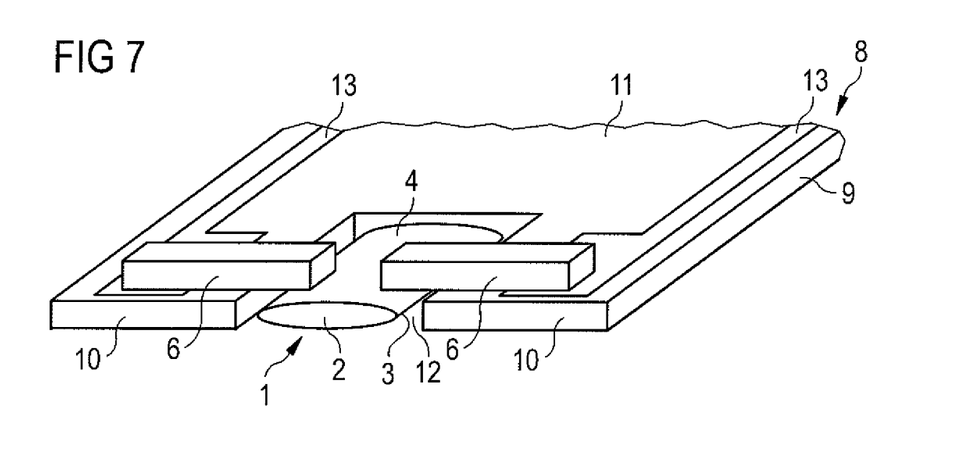
FIG. 7 is a schematic representation of a further exemplary embodiment of a support arrangement with one miniature housing.

For the housing body 3 of the miniature housing 1 a cuboid geometry has so far always been used in the exemplary embodiments for the sake of simplicity, since this is very common. This geometry is of course not absolutely essential. FIG. 7 shows a housing body 3 with a rectangular outline and an ellipsoidal passage side 2. The minimum requirement is that the housing body 3 of the miniature housing 1 comprise at least a top 3 which may be described as flat in the broadest sense. Thus only very broad limits are set to the geometry of the housing bodies. Depending on the production and requirements of the miniature housings 1, configurations of the housing body 3 with a semicircular, round, polygonal or triangular outline may be provided with suitable terminal means 6, which may be fitted either laterally or on the top 4 or bottom of the housing body 3.

FIG. 2 shows an exemplary embodiment of a support arrangement 8, whose miniature housing 1 has already been described above. This support arrangement 8 includes a support 9, which does not comprise any recesses 12 but has electrical supply conductors 13 on the support top 11 and bottom, which may be contacted with a miniature housing 1. By providing the support 8 with supply conductors 13 on both sides, particularly simple guidance of the supply conductors 13 may be realised and dedicated access from outside the support arrangement 8 to the supply conductors 13 is particularly simple, for instance at the side of the support 9. In FIG. 2 for reasons of clarity the supply conductors 13 are guided from the individual miniature housings 1 towards the rear. Alternatively, the supply conductors 13 on the support top 11 and support bottom may likewise run along the support front 10.

Since the terminal means 6 of the miniature housing 1 are guided towards the rear, the lateral space requirements thereof are very small and a high packing density of the miniature housing 1 along the support front 10 may be achieved. As a result of the high packing density good thermal contact with a thermally conductive support 9 has a particularly advantageous effect.

For simplicity's sake, in FIG. 2 the miniature housings 1 are fitted only on the support front 11. A configuration in which a further row of miniature housings is mounted on the support back, the support arrangement 1 thus being able to emit or receive at the front and back, may be provided. This also applies to any further exemplary embodiments.

The described arrangement of the miniature housings 1 is likewise suitable if a flexible support is used to obtain an overall flexible support arrangement 8. If the terminal means 6 extend only a slight distance along the support front 10, only slight shear stresses arise over the contacting faces 7 during bending of the support arrangement 8 and small bending radii become possible. The same applies to any of the exemplary embodiments below.

Figure 4:
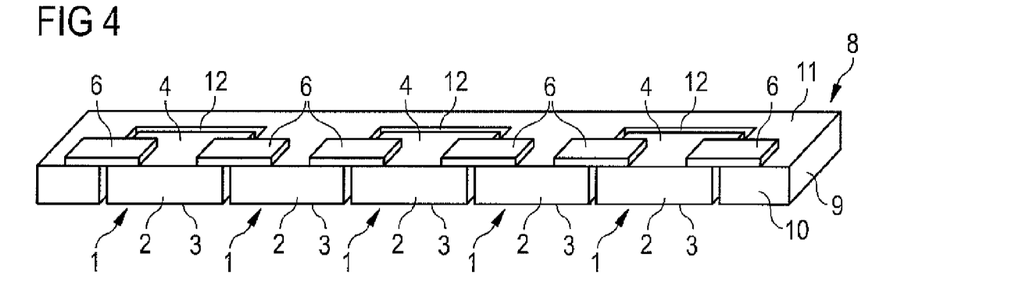
FIG. 4 is a schematic representation of a further exemplary embodiment of a support arrangement with a plurality of miniature housings.

FIG. 4 shows a further exemplary embodiment of a support arrangement 8. Once again, it comprises a plurality of miniature housings 1, whose terminal means 6 project beyond the housing body 3 on opposing sides and are fitted on the top 4 thereof. Moreover, the passage side 2 of the miniature housings 1 terminates flush with the support front 10, such that a compact arrangement arises without sensitive parts projecting out far. Space requirements in the rearward direction are likewise very small. Electrical supply conductors 13 are arranged on the support top 11.

Figure 5:
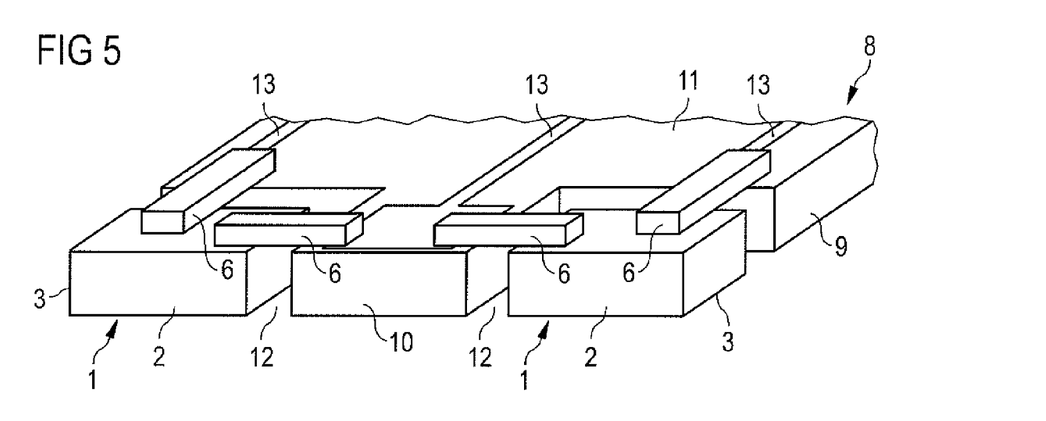
FIG. 5 is a schematic representation of a further exemplary embodiment of a support arrangement with two miniature housings.

FIG. 5 shows a support arrangement 8 which comprises two miniature housings 1. In this case recesses 12 are located at the corners of a support 9. As a possible variant, the electrical terminal means 6 of the miniature housing 1 are guided out beyond the housing body 3 on two sides. In this case this is a favourable configuration, since the miniature housings 1 are embedded in the recesses 12 at the corners of the support 9, wherein the passage sides 2 and side walls of the housing bodies 3 of the miniature housings 1 terminate flush with the support 9. Embodiments of the miniature housings 1 described further above and other arrangements thereof on the support 9 may likewise be used.

FIG. 7 shows a particularly narrow configuration of the support arrangement 1, which contains just a single miniature housing 1. Extensions along the support front 10 of just a few millimetres can be achieved in this way. This embodiment may once again be combined with the configurations already described above of the miniature housings 1 and supports 9.

Figure 6A:
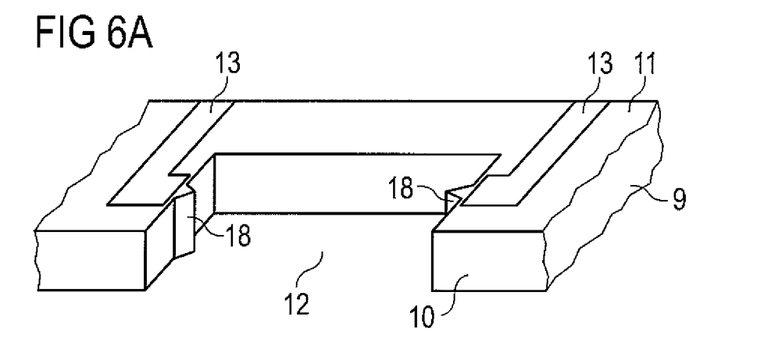
FIG. 6 is a schematic representation of different configurations a) and b) of the recess in the support.

In FIG. 6 the focus of the illustration is on the shape of the recess 12. FIG. 6a shows a recess 12 comprising a narrowed portion parallel to the support front 10. The intention of providing a narrowed portion is to position and/or lock the miniature housing 1 better in the recess 12. As in FIG. 6a, the narrowed portion may be located in the middle region of the recess 12, or indeed roughly in the vicinity of the support front 10. In order to push the miniature housing 1 simply for example from above or from the front into the recess 12, different configurations are advantageous. The narrowed portion may take the form not only, as illustrated, of two equal-sided prism-like projections 18, but also of different-shaped projections 18 such as polygons or round shapes. The projections 18 on the two sides of the narrowed portion do not have to be opposite one another, but rather may also be offset relative to one another. Likewise, differently configured projections 18 may be combined, the use of for example two projections 18 located close to one another, which are opposite just one projection 18 on the other side of the recess 12, also being possible. It is likewise not necessary for the narrowed portion to have the same width from the top to the bottom over the height of the support 9. If the miniature housing 1 is inserted from above into the recess 12, V-shaped narrowed portions, which taper downwards to a narrower width, i.e. are wedge-shaped projections 18 with regard to height, are very suitable. Production by injection moulding and die casting results in significant scope for shaping of the recess 12, and thus also of the narrowed portion, with frequently the same manufacturing effort.

Figure 6B:
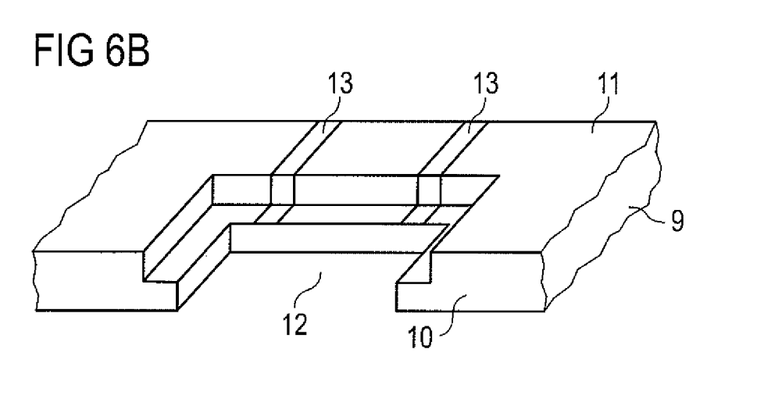

FIG. 6b shows an example of configuration of the recesses 12 as a form fit. Here the recess 12 is of stepped construction. In this way, the electrical terminal means 6 may likewise be embedded in the recess, since the supply conductors 13 are suitably laid, and no components project beyond the support top 11. If the housing body 3 rests at least partially on at least one step, the housing body may also be fitted on the support 9 in defined manner with regard to height. In particular in the case of tightly dimensioned supply conductors 13, precise positioning of the miniature housing 1 may in this way be achieved in three spatial directions by means of the recess 12. In addition the housing body 3 may also comprise stepped side faces, such that the area of the housing body 3 bearing on the recess 12 is enlarged and better positioning or locking is thereby obtained. In addition, the housing body 3 may then make full use of the entire volume of the recess 12. However the recesses 12 are not limited to a stepped embodiment. Conical or pyramidal shapes are for instance also possible, or shapes which correspond well geometrically to the housing body 3 and/or terminal means 6. A combination of form fit and narrowed portions may result in a sensible further development.

In FIGS. 6a and 6b the electrical supply conductors 13 are fitted in a simplified manner laterally of or alongside the recess 12. However this does not mean the embodiment of the supply conductors 13 is limited in any way.

Figure 8:
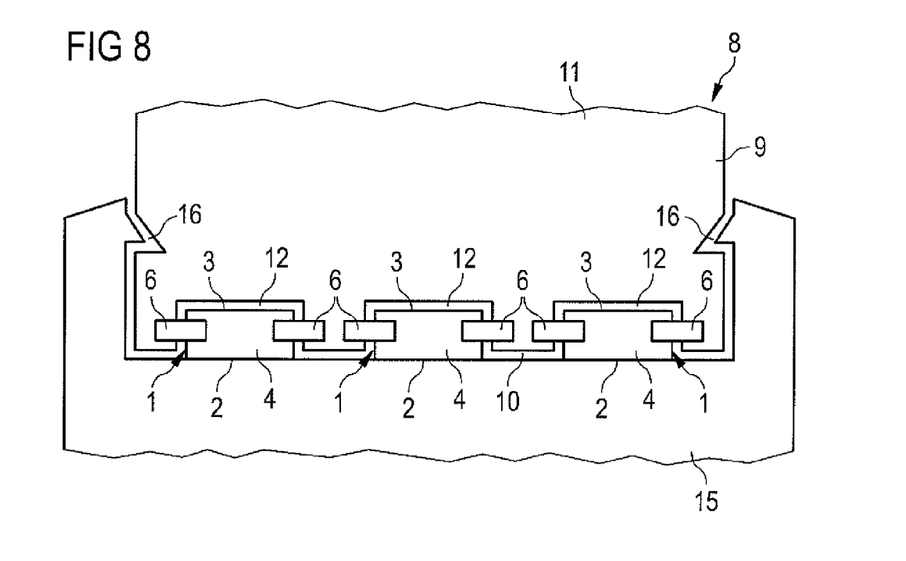
FIG. 8 is a schematic representation of an exemplary embodiment of a support arrangement combined with a light guide.

In addition to the support arrangement 1 FIG. 8 shows the possibility of positioning or fixing a light guide 15 on the support 9 for instance by suitable notches 16. The miniature housings 1 do not in this case terminate flush with the support front 10, in order to ensure better contact with the light guide 15. This arrangement of the miniature housings 1 on the support 9 constitutes a further option.

In FIG. 8 a notch 16 is provided in each case laterally in the support 9, in order to position the light guide 15 laterally and thus not to add to the height extent. In addition to a single notch 16 a plurality of notches 16 or indeed slits, also of different shapes, may also be provided, which unlike in FIG. 8, may also be provided asymmetrically. The provision of for example notches 16 is also not limited to the lateral regions of the support 9; such configurations on the support front 10 or support rear likewise offer advantages when it comes to ensuring easy, precise positioning for instance on an appliance housing enclosing the support arrangement 8. Positioning or locking may also serve as a temporary holding means or manufacturing aid for an adhesive bonding process, in which a support arrangement 8 is connected to a light guide or appliance housing, until an adhesive or indeed a solder sets.

Figure 9:
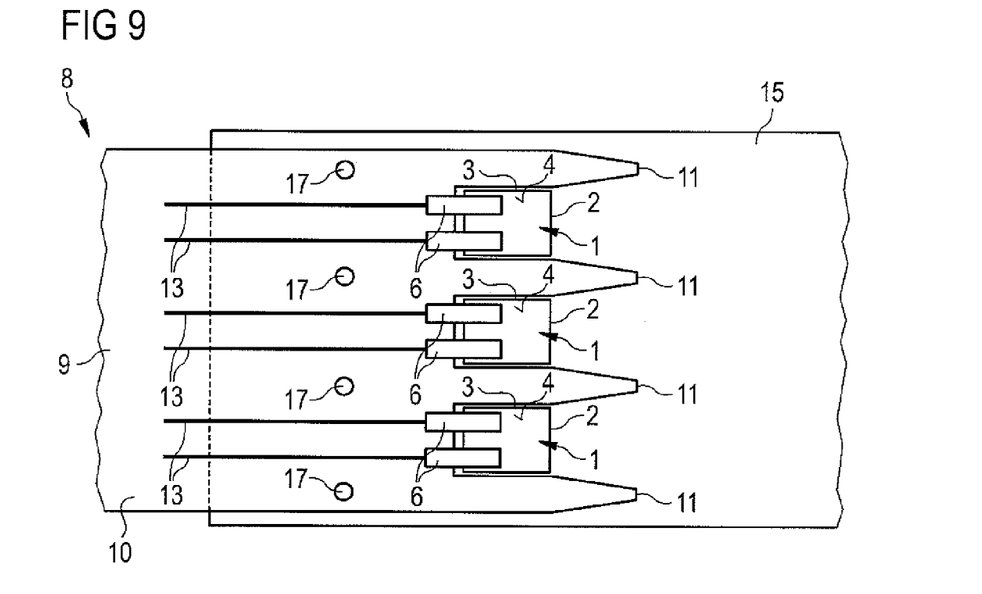
FIG. 9 is a schematic representation of a further exemplary embodiment of a support arrangement combined with a light guide.

FIG. 9 shows a support arrangement 8 with circular openings 17 in the support 9, which, also in combination with notches 16 or slits etc., may be used for instance for fixing a light guide 15. Openings 17 are particular suitable, for instance in the context of an injection moulding or die casting process, for stably connecting the support arrangement 8 to for example a light guide, since the material to be cast may form solid bridges through the openings 17. Protuberances or bumps on the support top 11 or support bottom are suitable for this purpose. There are no narrow limits to the specific embodiment of the openings 17 or bumps. If for example the support arrangement 8 is suitably encapsulated by injection moulding, space requirements, in particular with regard to height, are increased only slightly.

In the exemplary embodiment according to FIG. 9 the miniature housing 1 is set back further relative to the support front 10, such that the support front 10 projects clearly beyond the miniature housing 1. This offers the possibly sensitive passage sides 2 of the miniature housing 1 additional protection against for example scratching and, in the case of a casting process, reinforces the connection between a light guide 15 or an appliance housing by means of a type of toothing. The toothing may be reinforced if at least one outer surface of the support 9 is additionally roughened artificially in the relevant areas.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. A support arrangement, comprising:
   at least one miniature housing having:
      a housing body to contain a light emitting or a light receiving element, the housing body having a light passage side for passage of light from or to the element, and a top oriented transverse to the light passage side;
      conductors to electrically connect the element to the outside of the housing body; and
      electrical terminals connected to the conductors, the terminals projecting laterally beyond the housing body and comprising contacting faces oriented parallel to the top of the housing body; and
   a support comprising a support front oriented parallel to the light passage side of the miniature housing, a support top oriented transverse to the support front, and a support bottom, the electrical terminals resting flat on the support top or the support bottom;
   wherein:
      the support defines at least one recess completely penetrating the support in a direction perpendicular to the support top and interrupting the support front;
      the recess has a stepped configuration or is configured with at least one narrowed portion parallel to the support front;
      the housing body and the recess are configured, at least in part, to form fit relative to one another; and
      the miniature housing rests completely in the recess.

2. The support arrangement according to claim 1, wherein the electrical terminals project beyond the housing body on two opposing sides.

3. The support arrangement according to claim 1, wherein parts of the electrical terminals projecting beyond the housing body are in the form, at least in part, of small plates and/or are L-shaped.

4. The support arrangement according to claim 1, wherein parts of the electrical terminals projecting laterally beyond the housing body are fitted on the top or a bottom of the housing body and/or extend as extensions of the top and/or the bottom of the housing body.

5. The support arrangement according to claim 1, wherein a height of the miniature housing amounts to less than a third of a maximum lateral extent of the housing body.

6. The support arrangement according to claim 1, wherein a height of the miniature housing is less than 0.8 mm.

7. The support arrangement according to claim 1, wherein the housing body is located in front of the support front.

8. The support arrangement according to claim 1, wherein the housing body is arranged completely in front of the support front or completely in the recess.

9. The support arrangement according to claim 1, wherein the light passage side of the miniature housing terminates flush with the support front.

10. The support arrangement according to claim 1, wherein the extent of the support arrangement in the direction perpendicular to the support top is less than 1 mm.

11. The support arrangement according to claim 1, wherein the support comprises at least one positioning marker and/or retaining device in the form of a notch, recess, slit, bulge and/or bump.

12. A support arrangement, comprising:
a plurality of miniature housings, each miniature housing having:
a housing body to contain a light emitting or a light receiving element, the housing body having a light passage side for passage of light from or to the element, and a top oriented transverse to the light passage side;
conductors to electrically connect the element to the outside of the housing body; and
electrical terminals connected to the conductors, the terminals projecting laterally beyond the housing body and comprising contacting faces oriented parallel to the top of the housing body; and
a support comprising a support front oriented parallel to the light passage side of the miniature housing, a support top oriented transverse to the support front, and a support bottom, the electrical terminals resting flat on the support top or the support bottom;
wherein:
the support defines a plurality of recesses completely penetrating the support in a direction perpendicular to the support top and the recess interrupts the support front;
each recess contains a respective miniature housing;
the light passage sides of the miniature housings terminate flush with the support front; and
parts of the electrical terminals projecting beyond the respective housing bodies take the form, at least in part, of small plates arranged on the housing top and running along the support top,
wherein the recesses have a stepped configuration.

13. The support arrangement according to claim 12, wherein the recesses in the support and the housing bodies are configured, at least in part, to form fit relative to one another, and the miniature housings rest, at least in part, in a respective recess.

14. A support arrangement, comprising:
a plurality of miniature housings, each miniature housing having:
a housing body to contain a light emitting or a light receiving element, the housing body having a light passage side for passage of light from or to the element, and a top oriented transverse to the light passage side;
conductors to electrically connect the element to the outside of the housing body; and
electrical terminals connected to the conductors, the terminals projecting laterally beyond the housing body and comprising contacting faces oriented parallel to the top of the housing body; and
a support comprising a support front oriented parallel to the light passage side of the miniature housing, a support top oriented transverse to the support front, and a support bottom, the electrical terminals resting flat on the support top or the support bottom;
wherein:
the support defines a plurality of recesses completely penetrating the support in a direction perpendicular to the support top and the recess interrupts the support front;
each recess contains a respective miniature housing;
the light passage sides of the miniature housings terminate flush with the support front; and
parts of the electrical terminals projecting beyond the respective housing bodies take the form, at least in part, of small plates arranged on the housing top and running along the support top;
wherein the recesses are configured with at least one narrowed portion parallel to the support front.

* * * * *